United States Patent
Oda

(10) Patent No.: US 10,855,248 B2
(45) Date of Patent: Dec. 1, 2020

(54) ELECTRONIC COMPONENT AND METHOD OF MANUFACTURING THE SAME

(71) Applicant: TAIYO YUDEN CO., LTD., Tokyo (JP)

(72) Inventor: Yasuyuki Oda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 420 days.

(21) Appl. No.: 15/796,539

(22) Filed: Oct. 27, 2017

(65) Prior Publication Data
US 2018/0159504 A1 Jun. 7, 2018

(30) Foreign Application Priority Data
Dec. 2, 2016 (JP) ................................ 2016-235203

(51) Int. Cl.
*H03H 3/007* (2006.01)
*H03H 9/10* (2006.01)
(Continued)

(52) U.S. Cl.
CPC .......... *H03H 9/1064* (2013.01); *H03H 3/007* (2013.01); *H03H 3/02* (2013.01);
(Continued)

(58) Field of Classification Search
CPC .... H03H 9/1064; H03H 3/007; H03H 9/1007; H03H 2003/0071; H01L 2224/16; H01L 2924/16195
See application file for complete search history.

(56) References Cited

U.S. PATENT DOCUMENTS

| 5,438,305 A * | 8/1995 | Hikita ..................... H01L 23/66 174/551 |
| 2009/0096321 A1* | 4/2009 | Aikawa .................... H03H 3/08 310/313 R |

(Continued)

FOREIGN PATENT DOCUMENTS

| JP | 2014-27249 A | 2/2014 |
| JP | 2014-056880 A | 3/2014 |

(Continued)

OTHER PUBLICATIONS

English Translation of JP 2016032171 (Year: 2016).*
(Continued)

*Primary Examiner* — Bryan P Gordon
(74) *Attorney, Agent, or Firm* — Chen Yoshimura LLP

(57) ABSTRACT

An electronic component includes: a substrate; a device chip, in which a functional element is located on a lower surface thereof, that is mounted on an upper surface of the substrate so that the functional element and the upper surface of the substrate are opposite to each other via an air gap; a ring-shaped metal layer that is located on the upper surface of the substrate, surrounds the device chip in a plan view, and has a protruding part located along an outer periphery thereof, an outer side surface of the ring-shaped metal layer being higher than an inner side surface thereof; a metal sealer that surrounds the device chip in the plan view, and is bonded on an upper surface of the ring-shaped metal layer; and a metal film that is located on side surfaces of the metal sealer and the ring-shaped metal layer.

8 Claims, 12 Drawing Sheets

(51) Int. Cl.
*H03H 3/02* (2006.01)
*H03H 9/05* (2006.01)

(52) U.S. Cl.
CPC ........ *H03H 9/0547* (2013.01); *H03H 9/1007* (2013.01); *H01L 2224/16* (2013.01); *H01L 2924/16195* (2013.01); *H03H 2003/0071* (2013.01)

(56) References Cited

U.S. PATENT DOCUMENTS

2013/0337610 A1   12/2013   Oda et al.
2017/0272051 A1*   9/2017   Kurihara .............. H03H 9/6483
2017/0288121 A1*   10/2017   Burak ................ H03H 9/02015

FOREIGN PATENT DOCUMENTS

JP       2016-032171 A    3/2016
WO    2016/067664 A1    5/2016

OTHER PUBLICATIONS

English Translation of JP 2014056880 (Year: 2014).*
Japanese Office Action dated Jun. 18, 2019, in a counterpart Japanese patent application No. 2016-235203. (A machine translation (not reviewed for accuracy) attached.).
Japanese Office Action dated Nov. 13, 2018, in a counterpart Japanese patent application No. 2016-235203. (A machine translation (not reviewed for accuracy) attached.).

* cited by examiner

ELECTRONIC COMPONENT AND METHOD OF MANUFACTURING THE SAME

CROSS-REFERENCE TO RELATED APPLICATION

This application is based upon and claims the benefit of priority of the prior Japanese Patent Application No. 2016-235203, filed on Dec. 2, 2016, the entire contents of which are incorporated herein by reference.

FIELD

A certain aspect of the present invention relates to an electronic component and a method of manufacturing the same.

BACKGROUND

There has been known to mount a device chip on a substrate and seal the device chip by a metal sealer such as a solder provided around the device chip in a plan view. The following method is known as a method of manufacturing such an electronic component. A ring-shaped metal layer surrounding the device chip is provided on an upper surface of the substrate. The metal sealer is bonded to the ring-shaped metal layer, so that the metal sealer is bonded to the upper surface of the substrate. A metal film for protecting the metal sealer is provided on side surfaces of the metal sealer and the ring-shaped metal layer (e.g. Japanese Patent Application Publication No. 2014-27249).

However, when the adhesion between the side surface of the ring-shaped metal layer and the metal film is weak, the metal film is peeled from the ring-shaped metal layer. Thereby, the metal film cannot properly protect the metal sealer.

SUMMARY OF THE INVENTION

According to an aspect of the present invention, there is provided an electronic component including: a substrate; a device chip, in which a functional element is located on a lower surface thereof, that is mounted on an upper surface of the substrate so that the functional element and the upper surface of the substrate are opposite to each other via an air gap; a ring-shaped metal layer that is located on the upper surface of the substrate, surrounds the device chip in a plan view, and has a protruding part located along an outer periphery thereof, an outer side surface of the ring-shaped metal layer being higher than an inner side surface thereof; a metal sealer that surrounds the device chip in the plan view, and is bonded on an upper surface of the ring-shaped metal layer; and a metal film that is located on side surfaces of the metal sealer and the ring-shaped metal layer.

DETAILED DESCRIPTION

Hereinafter, embodiments of the present invention will be described with reference to the accompanying drawings.

First Embodiment

Figure 1A:
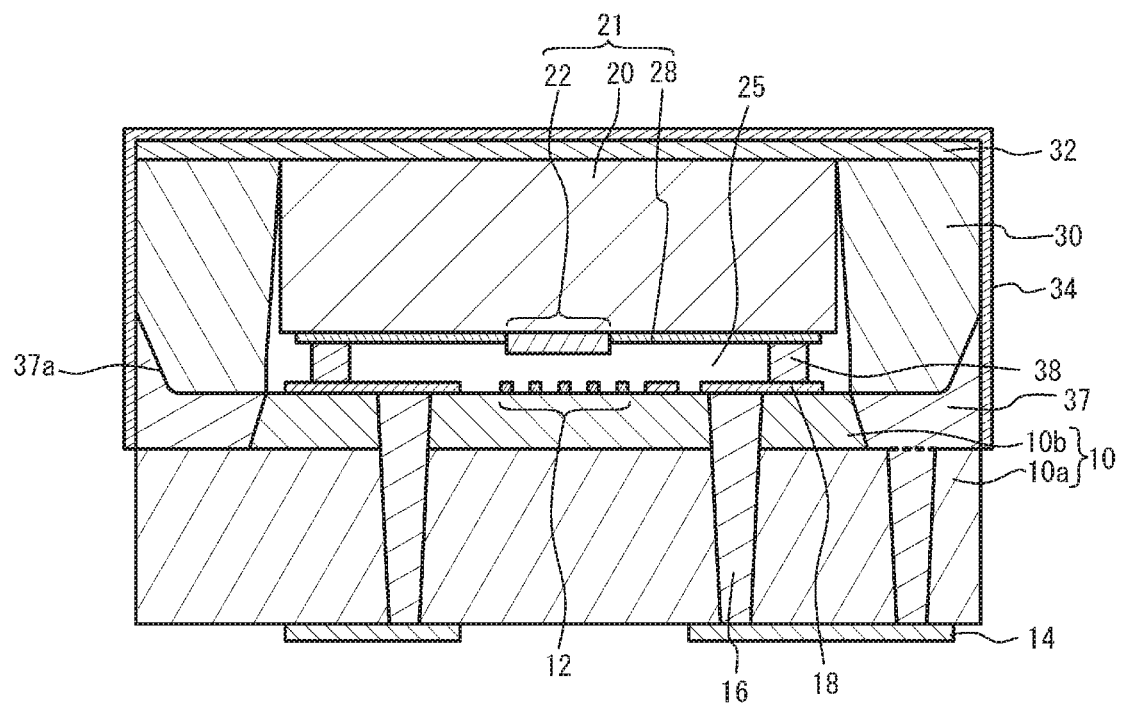
FIG. 1A is a cross-sectional view of an electronic component according to a first embodiment.
Figure 1B:
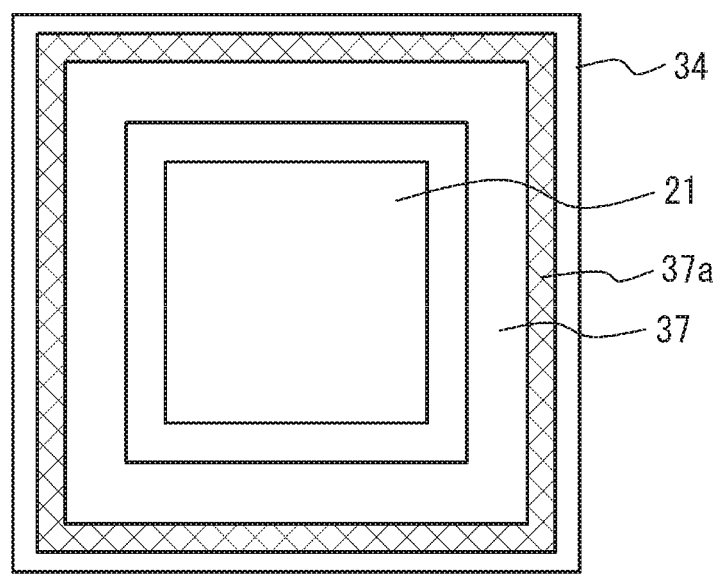
FIG. 1B is a plan view of the electronic component according to the first embodiment.

FIG. 1A is a cross-sectional view of an electronic component according to a first embodiment, and FIG. 1B is a plan view of the electronic component according to the first embodiment. FIG. 1B illustrates a device chip 21 and a ring-shaped metal layer 37. As illustrated in FIG. 1A, a substrate 10 includes a support substrate 10a and a piezoelectric substrate 10b. The support substrate 10a is, for example, a sapphire substrate, a spinel substrate, an alumina substrate or a silicon substrate. The piezoelectric substrate 10b is, for example, a lithium tantalate substrate or a lithium niobate substrate. The piezoelectric substrate 10b is bonded on the upper surface of the support substrate 10a. The bonded surface of the piezoelectric substrate 10b and the support substrate 10a is a plain surface and flat. Terminals 14 are located on the lower surface of the substrate 10. The terminals 14 are foot pads for connecting functional elements 12 and 22 to external devices.

The functional element 12 and wiring lines 18 are located on the upper surface of the substrate 10. Via wirings 16 penetrating through the substrate 10 are provided. The terminals 14, the via wirings 16, and the wiring lines 18 are formed of, for example, a metal layer such as a copper layer, an aluminum layer, or a gold layer. The via wirings 16 electrically connect the wiring lines 18 and the terminals 14, respectively. A ring-shaped metal layer 37 is located in the outer periphery of the upper surface of the substrate 10. A protruding part 37a is located in the outer periphery of the ring-shaped metal layer 37. An apex of the protruding part 37a is located above the lower surface of the device chip 21. The ring-shaped metal layer 37 is formed of a metal layer such as a copper layer, a nickel layer, a gold layer, an aluminum layer and a silver layer, or a laminated film thereof.

The device chip 21 includes a substrate 20 and a functional element 22. The functional element 22 and wiring lines 28 are located on the lower surface of the substrate 20.

The substrate 20 is, for example, an insulating substrate such as a sapphire substrate, a spinel substrate, an alumina substrate, or a semiconductor substrate such as a silicon substrate. The wiring lines 28 are formed of, for example, a metal layer such as a copper layer, an aluminum layer, or a gold layer. The substrate 20 is flip-chip mounted (face-down mounted) on the substrate 10 thorough bumps 38. The bumps 38 are, for example, gold bumps, solder bumps, or copper bumps. The bumps 38 bonds the wiring lines 28 and 18.

A metal sealer 30 is located on the substrate 10 so as to surround the device ship 21 in the plan view. The metal sealer 30 is made of, for example, a metallic material such as solder. The metal sealer 30 is bonded on the upper surface of the ring-shaped metal layer 37. A flat plate-like lid 32 is located on the upper surface of the substrate 20 and the upper surface of the metal sealer 30. The lid 32 is, for example, a metal plate or an insulating plate. A protective film 34 is provided so as to cover the lid 32 and the metal sealer 30. The protective film 34 is a metal film such as a nickel film, and a melting point of the protective film 34 is higher than that of the metal sealer 30.

The functional elements 12 and 22 are opposite to each other across an air gap 25. The air gap 25 is sealed by the metal sealer 30, the substrate 10, the substrate 20 and the lid 32. The bumps 38 are surrounded by the air gap 25. The terminals 14 are electrically connected to the functional element 12 through the via wirings 16, and the wiring lines 18. The terminals 14 are also electrically connected to the functional element 22 through the via wirings 16, the wiring lines 18, the bumps 38, and the wiring lines 28. The metal sealer 30 is grounded.

As illustrated in FIG. 1B, the ring-shaped metal layer 37 is located on the periphery of the substrate 10, and surrounds the device chip 21. The protruding part 37a is located along the outer periphery of the ring-shaped metal layer 37.

Figure 2A:
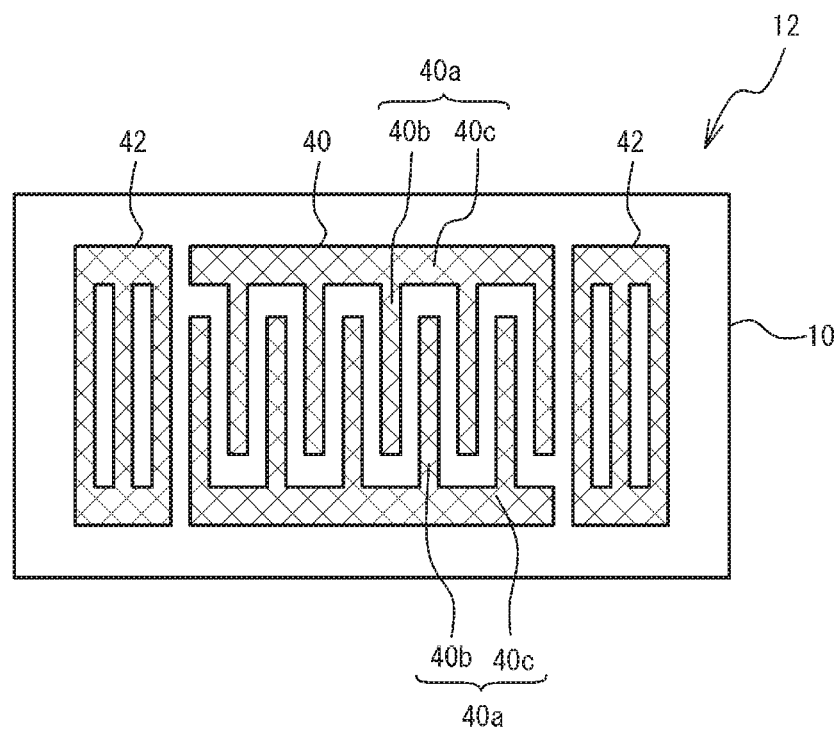
FIG. 2A is a plan view of a functional element.
Figure 2B:
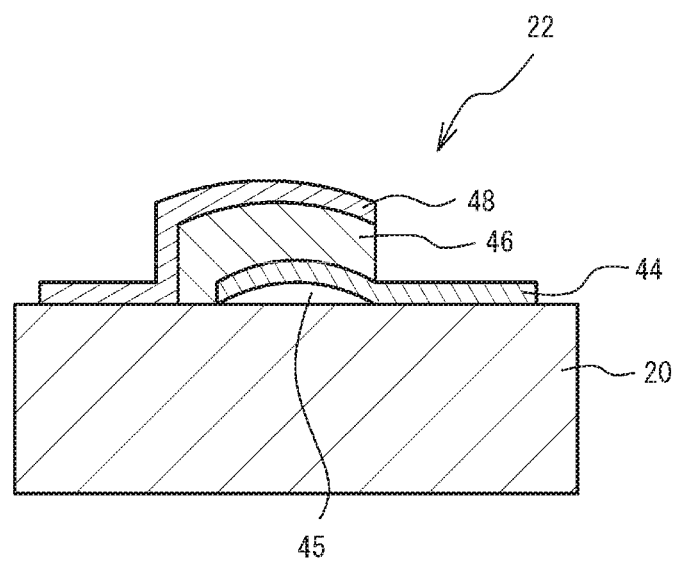
FIG. 2B is a cross-sectional view of the functional element.

FIG. 2A is a plan view of the functional element 12, and FIG. 2B is a cross-sectional view of the functional element 22. As illustrated in FIG. 2A, the functional element 12 is a surface acoustic wave resonator. An Interdigital Transducer (IDT) 40 and reflectors 42 are formed on the substrate 10. The IDT 40 includes a pair of comb-shaped electrodes 40a opposite to each other. The comb-shaped electrode 40a includes a plurality of electrode fingers 40b and a bus bar 40c to which the electrode fingers 40b are connected. The reflectors 42 are located at the both sides of the IDT 40. The IDT 40 excites a surface acoustic wave on the piezoelectric substrate 10b. The IDT 40 and the reflectors 42 are formed of, for example, an aluminum film or a copper film. A protective film or temperature compensation film for covering the IDT 40 and the reflectors 42 may be provided. In this case, the IDT 40 and the reflectors 42 along with the protective film or temperature compensation film serve as the functional element 12.

As illustrated in FIG. 2B, the functional element 22 is a piezoelectric thin film resonator. A piezoelectric film 46 is located on the substrate 20. A lower electrode 44 and an upper electrode 48 are provided so as to sandwich the piezoelectric film 46. An air gap 45 is formed between the lower electrode 44 and the substrate 20. The lower electrode 44 and the upper electrode 48 excite the acoustic wave in the thickness extension mode in the piezoelectric film 46. The lower electrode 44 and the upper electrode 48 are formed of, for example, a metal film such as a ruthenium film. The piezoelectric film 46 is, for example, an aluminum nitride film.

The functional elements 12 and 22 include electrodes that excite acoustic waves. Thus, the functional elements 12 and 22 are covered with the air gap 25 so as not to restrain the acoustic waves.

Hereinafter, exemplary materials and dimensions of the first embodiment will be described. The support substrate 10a is a sapphire substrate with a film thickness of 100 µm. The piezoelectric substrate 10b is a lithium tantalate substrate with a film thickness of 10-20 µm. When the linear thermal expansion coefficient of the support substrate 10a is less than that of the piezoelectric substrate 10b, the frequency-temperature dependence of the acoustic wave element of the functional element 12 is small. The via wirings 16 are copper via wirings. The bumps 38 are gold bumps. The substrate 20 is a silicon substrate. The metal sealer 30 is made of SnAg solder. The lid 32 is made of a kovar plate with a film thickness of 15 µm. The protective film 34 is formed of a nickel layer with a film thickness of 10 µm.

Manufacturing Method of First Embodiment

Figure 3A:
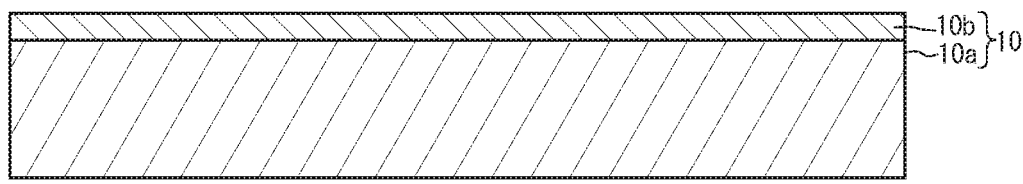
FIGS. 3A to 3D are cross-sectional views illustrating a method of manufacturing the electronic component according to the first embodiment (part 1)

FIGS. 3a to 6 are cross-sectional views illustrating a method of manufacturing the electronic component according to the first embodiment. As illustrated in FIG. 3A, the lower surface of the piezoelectric substrate 10b is bonded to the upper surface of the support substrate 10a. This bonding is performed in a wafer state. Examples of a bonding method include, but are not limited to, a method that activates the upper surface of the support substrate 10a and the lower surface of the piezoelectric substrate 10b and then bonds them at room temperature, or a method that bonds them with an adhesive agent.

Figure 3B:
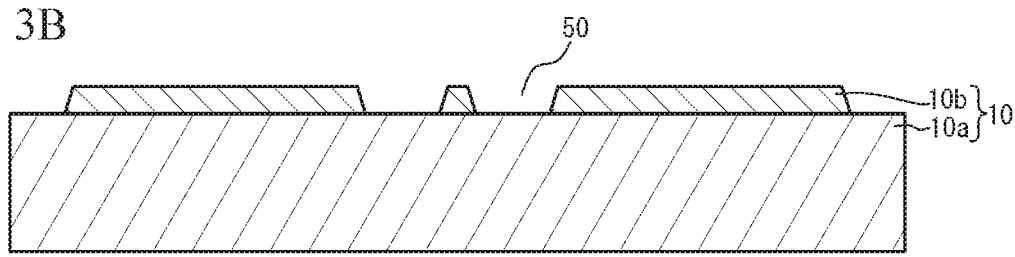

As illustrated in FIG. 3B, desired apertures 50 are formed in the piezoelectric substrate 10b. The apertures 50 are formed by, for example, blasting using a patterned photoresist as a mask. The apertures 50 may be formed by ion milling or wet eching instead of blasting.

Figure 3C:
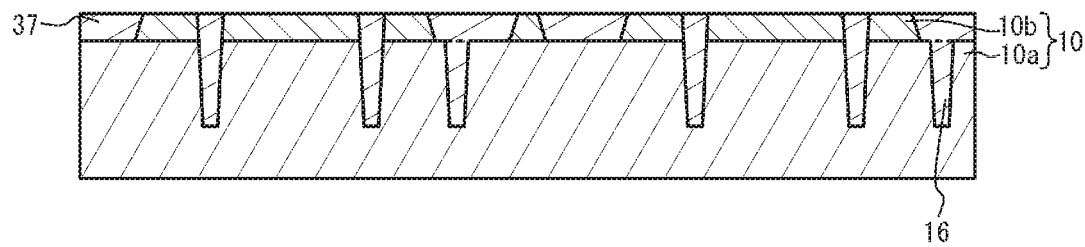

As illustrated in FIG. 3C, via holes are formed in the piezoelectric substrate 10b and the support substrate 10a. The via holes are formed by, for example, irradiating the piezoelectric substrate 10b and the support substrate 10a with a laser beam. A seed layer (not illustrated) is formed in the via holes and in the apertures 50. A current is supplied to the seed layer to form the via wirings 16 in the via holes and the ring-shaped metal layer 37 in the apertures 50 by electrolytic plating. When the via wirings 16 and the ring-shaped metal layer 37 are made of a copper layer, the seed layer may be, for example, a titanium film with a film thickness of 100 µm and a copper layer with a film thickness of 200 µm stacked in this order from the substrate 10 side. Unnecessary plated layers are removed by Chemical Mechanical Polishing (CMP) or the like.

Figure 3D:
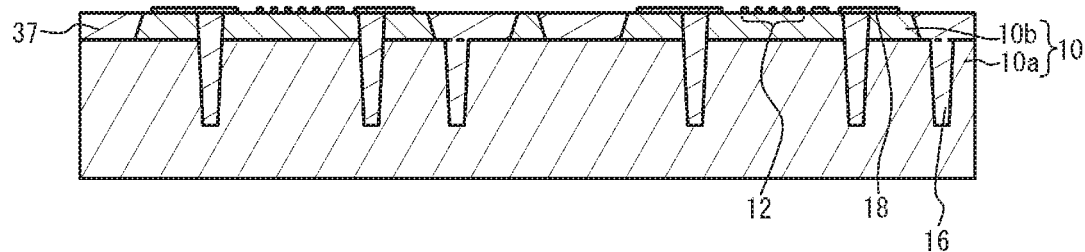

As illustrated in FIG. 3D, the functional elements 12 and the wiring lines 18 are formed on the upper surface of the piezoelectric substrate 10b. The functional elements 12 are formed of, for example, a titanium film and an aluminum film staked in this order from the substrate 10 side. The wiring lines 18 are formed of, for example, a titanium film and a gold film stacked in this order from the substrate 10 side.

Figure 4A:
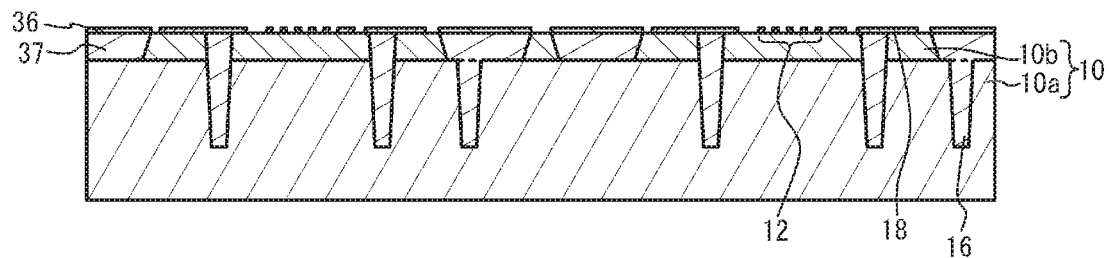
FIGS. 4A to 4D are cross-sectional views illustrating the method of manufacturing the electronic component according to the first embodiment (part 2)
Figure 4B:
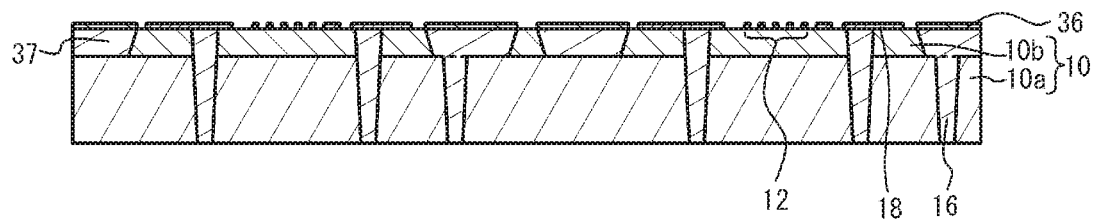

As illustrated in FIG. 4A, the ring-shaped electrodes 36 are formed on the ring-shaped metal layer 37. The ring-shaped electrodes 36 are formed of, for example, a titanium film and a nickel film stacked in this order from the substrate 10 side, and are formed by evaporation and liftoff. As illustrated in FIG. 4B, the lower surface of the substrate 10 is polished or ground. This process exposes the via wirings 16 from the lower surface of the substrate 10.

Figure 4C:
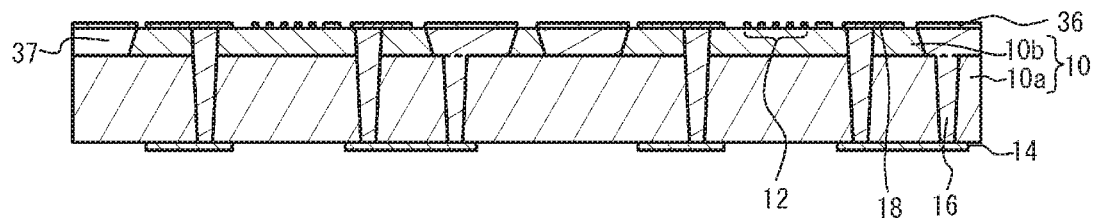

As illustrated in FIG. 4C, the terminals 14 are formed so as to make contact with the via wirings 16. For example, a seed layer is formed on the lower surface of the substrate 10. A photoresist having apertures is formed under the seed layer. A current is supplied to the seed layer to form a plated layer in the apertures by electrolytic plating. The seed layer other than the plated layer is then removed. The seed layer can be formed of, for example, a titanium film and a copper film stacked in this order from the substrate 10 side. The plated layer can be formed of, for example, a copper layer, a nickel layer, and a gold layer stacked in this order from the substrate 10 side.

Figure 4D:
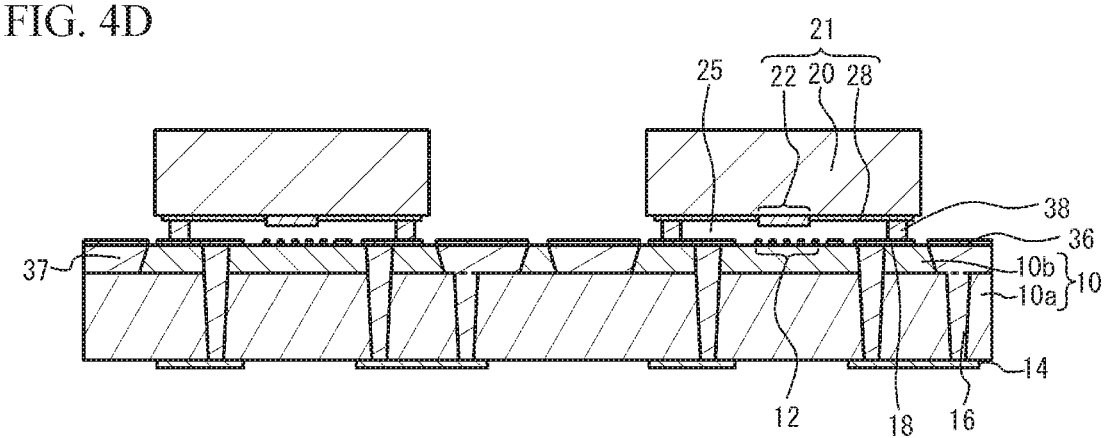

As illustrated in FIG. 4D, the substrates 20 are flip-chip mounted on the substrate 10. The substrate 20 is a chip after cutting the substrate 20 into individual chips, and gold stud bumps as the bumps 38 are formed on the lower surface of the substrate 20.

Figure 5A:
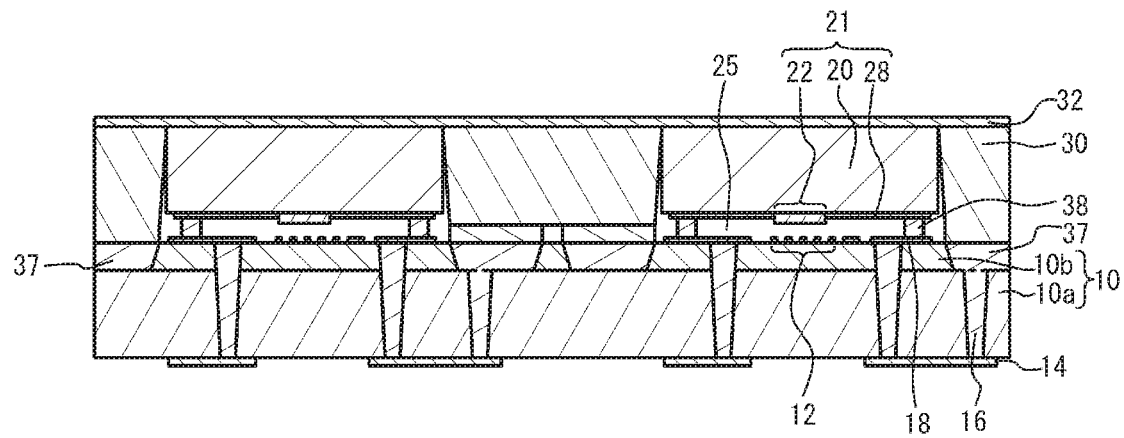
FIGS. 5A to 5C are cross-sectional views illustrating the method of manufacturing the electronic component according to the first embodiment (part 3)

As illustrated in FIG. 5A, a solder plate is formed on the substrate 10 so as to cover the substrate 20. The lid 32 is placed onto the solder plate. The solder plate is pressed to the substrate 10 by the lid 32, and the lid 32 is then heated to a temperature greater than the melting point of the solder plate. For example, the melting point of the SnAg solder is about 220° C., and the heated temperature is more than 230° C. This process melts the solder plate, and thereby forms the metal sealer 30. The metal sealer 30 forms an alloy with the ring-shaped electrode 36. This process bonds the metal sealer 30 with the ring-shaped metal layer 37. The lid 32 has a good solderability, and the metal sealer 30 is thus bonded to the lid 32. The lid 32 makes contact with the upper surface of the substrate 20, but is not bonded to the upper surface of the substrate 20.

Figure 5B:
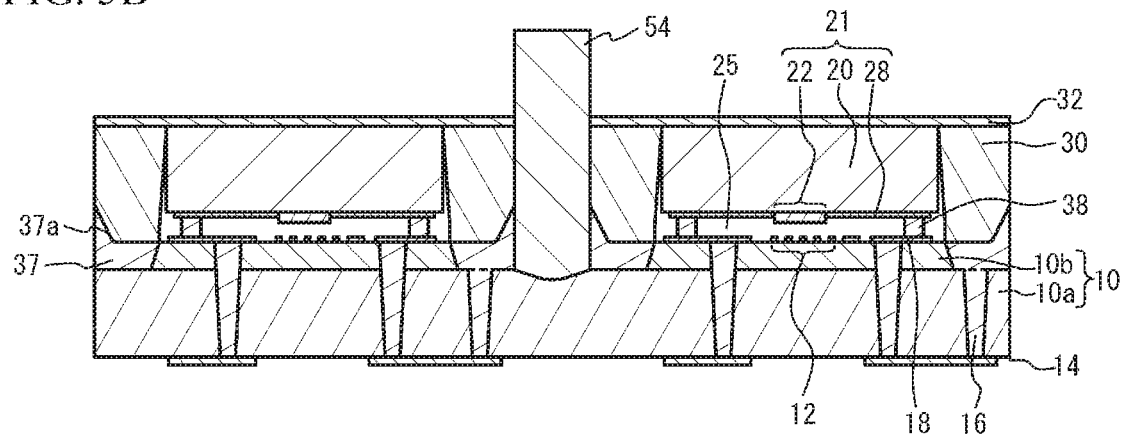

As illustrated in FIG. 5B, the lid 32, the metal sealer 30, and the ring-shaped metal layer 37 are cut by a dicing blade 54. Since the ring-shaped metal layer 37 is soft and easily extended, the dicing blade 54 cuts the ring-shaped metal layer 37 so as to be entangled in the ring-shaped metal layer 37. Thereby, the burr-like protruding part 37a of the ring-shaped metal layer 37 is formed on a cutting surface.

Figure 5C:
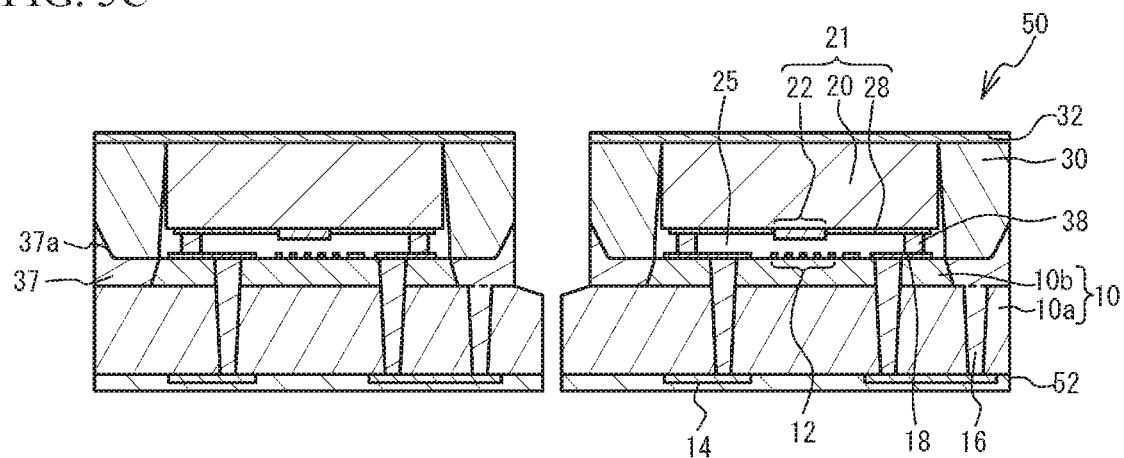

As illustrated in FIG. 5C, the lower surface of the substrate 10 is protected by a protective film 52 such as a photoresist. The substrate 10 is cut. Thereby, a plurality of electronic components 60 are individuated. The cutting of the substrate 10 is carried out by dicing using a dicing blade or cleaving after irradiating the substrate 10 with the laser beam.

Figure 6:
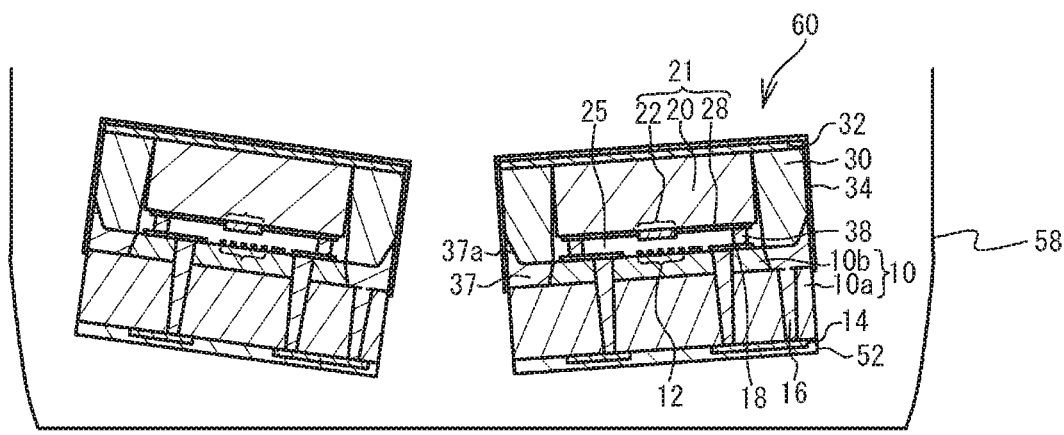
FIG. 6 is a cross-sectional view illustrating the method of manufacturing the electronic component according to the first embodiment (part 4)

As illustrated in FIG. 6, the plurality of electronic components 60 are put in a barrel (not illustrated), and the barrel is put in a plating tank 58. The protective film 34 is formed by, for example, barrel plating. The protective film 34 is formed of, for example, a nickel layer with a film thickness of 10 μm. The protective film 34 is mainly formed on a surface of the metallic material. The protective film 34 is therefore formed on the upper surface of the lid 32, the side surface of the metal sealer 30 and the side surface of the ring-shaped metal layer 37, but not formed on the side surface of the substrate 10 and the lower surface of the protective film 52. After the formation of the protective film 34, the protective film 52 is peeled. This process completes the electronic component of FIGS. 1A and 1B.

Figure 7:
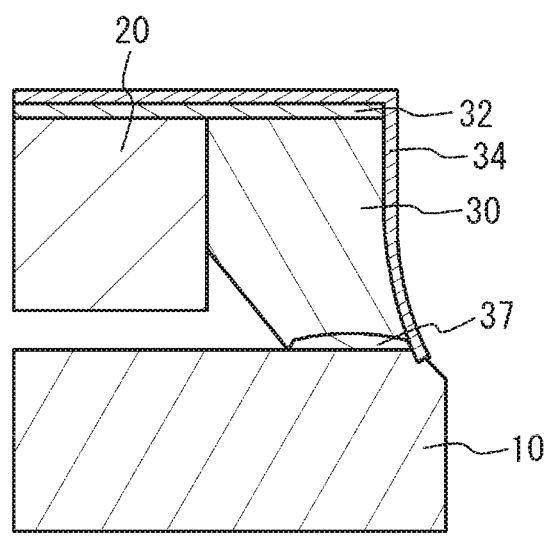
FIG. 7 is a cross-sectional view of an end of the electronic component according to a comparative example 1.

To explain an effect of the first embodiment, a description will be given of a comparative example 1. FIG. 7 is a cross-sectional view of an end of the electronic component according to the comparative example 1. As illustrated in FIG. 7, the ring-shaped metal layer 37 is flat compared with the first example. The heights of an outer side surface and an inner side surface of the ring-shaped metal layer 37 are approximately the same. When a hard material such as tungsten, for example, is used as the ring-shaped metal layer 37, the protruding part 37a is not formed even when the ring-shaped metal layer 37 is formed using dicing. Since the protruding part 37a is not formed, a contact area between the ring-shaped metal layer 37 and the protective film 34 is small. This makes an adhesion between the ring-shaped metal layer 37 and the protective film 34 low. Thus, the protective film 34 may be peeled from the ring-shaped metal layer 37. The protective film 34 has a function that protects the ring-shaped metal layer 37. For example, the protective film 34 suppresses that the ring-shaped metal layer 37 is deformed by reflow or the like in mounting the electronic component on a printed circuit board or the like. When the protective film 34 is peeled from the ring-shaped metal layer 37, the function as the protective film is impaired. Although it is considered to thicken the ring-shaped metal layer 37, the number of manufacturing steps is increased.

Figure 8A:
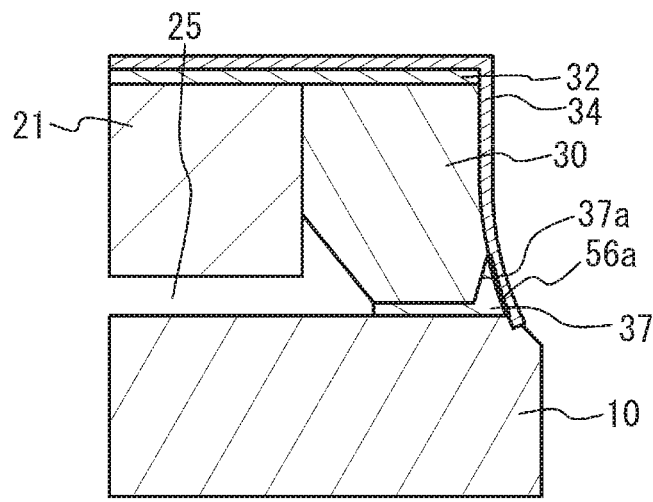
FIGS. 8A to 8C are cross-sectional views of an end of the electronic component according to the first embodiment.
Figure 8B:
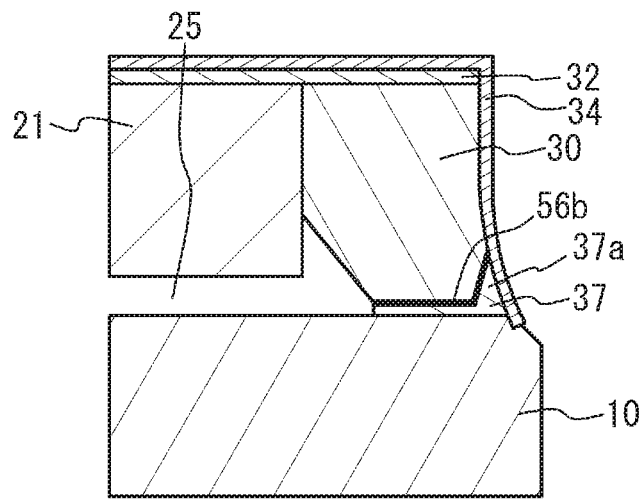
Figure 8C:
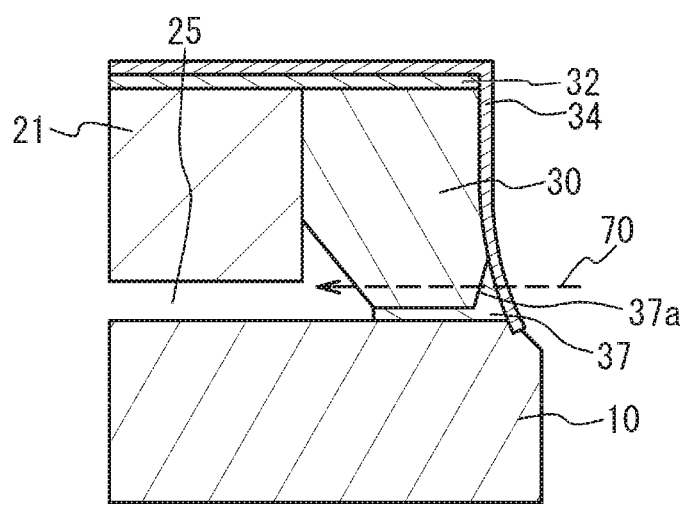

FIGS. 8A to 8C are cross-sectional views of an end of the electronic component according to the first embodiment. As illustrated in FIG. 8A, in the first embodiment, an area of a side surface 56a of the ring-shaped metal layer 37 is increased due to the protruding 37a. This makes it possible to improve the adhesion between the ring-shaped metal layer 37 and the protective film 34.

As illustrated in FIG. 8B, an area of an upper surface 56b of the ring-shaped metal layer 37 is increased due to the protruding part 37a. This makes it possible to improve a bonding strength between the metal sealer 30 and the ring-shaped metal layer 37.

As illustrated in FIG. 8C, three different types of metals of the protective film 34, the ring-shaped metal layer 37 and the metal sealer 30 are located on a dashed arrow 70. Thereby, a strength for a stress from a horizontal direction is improved.

For example, the thickness of the piezoelectric substrate 10b is 10 μm to 20 μm. When the upper surfaces of the piezoelectric substrate 10b and the ring-shaped metal layer 37 are flattened as illustrated in FIG. 3C, the thickness of the ring-shaped metal layer 37 is 10 μm to 20 μm. A distance between the upper surface of the substrate 10 and the lower surface of the device chip 21 (i.e, the lower surface of the functional element 22 in the first embodiment) is 10 μm to 20 μm. According to the experiments of the inventors, when the protruding part 37a is formed using the ring-shaped metal layer 37 of the copper layer as illustrated in FIG. 5B, the height of the protruding part 37a is approximately 1.5 to 2 times greater than the thickness of the ring-shaped metal layer 37. That is, the apex of the protruding part 37a is located above a middle position between the upper surface of the substrate 10 and the lower surface of the device chip 21.

In FIG. 5B, to form the protruding part 37a, the ring-shaped metal layer 37 is preferably formed of a soft material. The Vickers hardness of copper is 0.8 GPa. As the material having almost the same Vickers hardness as copper, nickel is 0.9 GPa, aluminum is 0.5 GPa, silver is 0.88 GPa, and gold is 0.9 GPa. These metals can be used as the ring-shaped metal layer 37.

According to the first embodiment, the ring-shaped metal layer 37 surrounds the device chip 21 in the plan view, the protruding part 37a is located along the outer periphery of the ring-shaped metal layer 37, and the outer side surface of the ring-shaped metal layer 37 is higher than the inner side surface thereof. The protective film 34 (i.e., the metal film)

is located on the side surfaces of the metal sealer 30 and the ring-shaped metal layer 37. This makes it possible to increase the area of the side surface 56a of the ring-shaped metal layer 37 and improve the adhesion between the ring-shaped metal layer 37 and the protective film 34 as illustrated in FIG. 8A. It is also possible to improve the bonding strength between the metal sealer 30 and the ring-shaped metal layer 37 as illustrated in FIG. 8B. Moreover, the strength for the stress from the horizontal direction is improved as illustrated in FIG. 8C.

The apex of the protruding part 37a of the ring-shaped metal layer 37 is located above the middle position between the upper surface of the substrate 10 and the lower surface of the device chip 21 (i.e., the lower surface of the functional element 22). This makes it possible to improve the adhesion between the ring-shaped metal layer 37 and the protective film 34. To further improve the adhesion between the ring-shaped metal layer 37 and the protective film 34, the apex of the protruding part 37a of the ring-shaped metal layer 37 is preferably located above the lower surface of the device chip 21. Additionally, the apex of the protruding part 37a of the ring-shaped metal layer 37 is more preferably located above the lower surface of the substrate 20 in the device chip 21.

The ring-shaped metal layer 37 is made of at least one of copper, nickel, gold, aluminium and silver. This makes it possible to form the protruding part 37a by cutting the ring-shaped metal layer 37 using dicing.

The lid 32 is located on the upper surfaces of the device chip 21 and the metal sealer 30. This makes it possible to hermetically seal the functional elements 12 and 22.

The substrate 10 includes the support substrate 10a and the piezoelectric substrate 10b bonded on the upper surface of the support substrate 10a, and the ring-shaped metal layer 37 is embedded in the piezoelectric substrate 10b. Thereby, even when the ring-shaped metal layer 37 is formed thickly, the ring-shaped metal layer 37 does not protrude from the upper surface of the substrate 10. Therefore, the designability is improved.

By cutting the metal sealer 30 and the ring-shaped metal layer 37 using the dicing blade 54 as illustrated in FIG. 5B, the protruding part 37a can be located on the ring-shaped metal layer 37 and along the outer periphery of the ring-shaped metal layer 37 so that the outer side surface of the ring-shaped metal layer 37 is higher than the inner side surface thereof. This makes it possible to suppress the increase of the number of manufacturing steps, and easily form the protruding part 37a.

Figure 9:
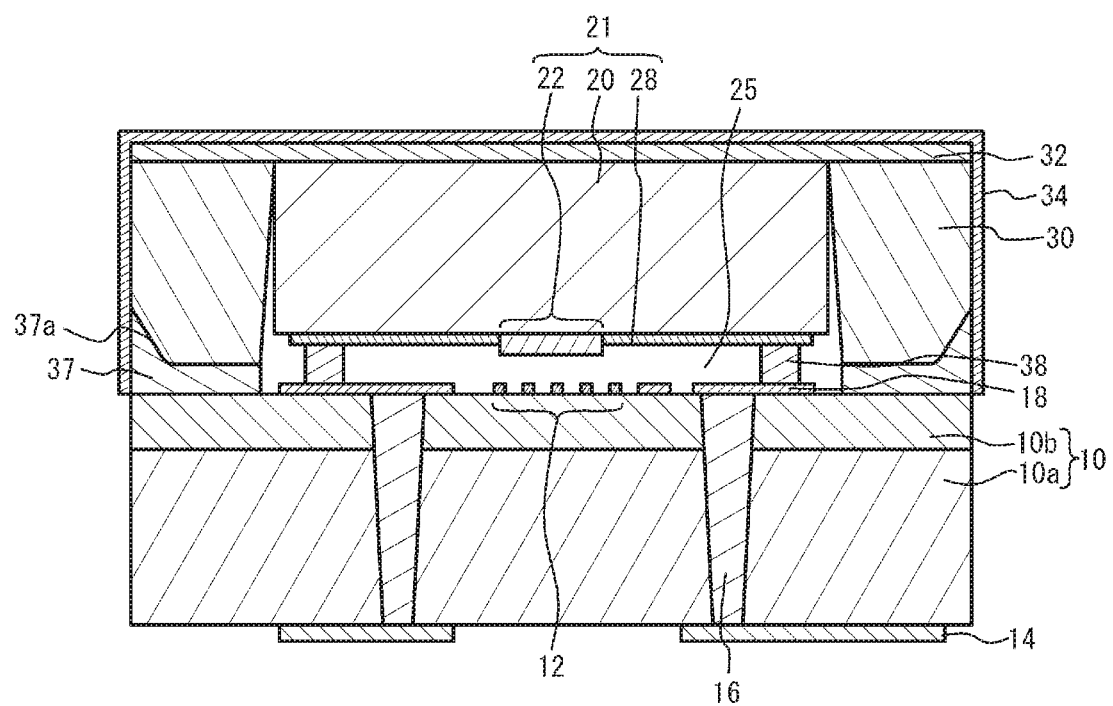
FIG. 9 is a cross-sectional view of an electronic component according to a first variation of the first embodiment.

FIG. 9 is a cross-sectional view of an electronic component according to a first variation of the first embodiment. As illustrated in FIG. 9, the ring-shaped metal layer 37 may be located on the piezoelectric substrate 10b without being embedded in the piezoelectric substrate 10b.

Figure 10:
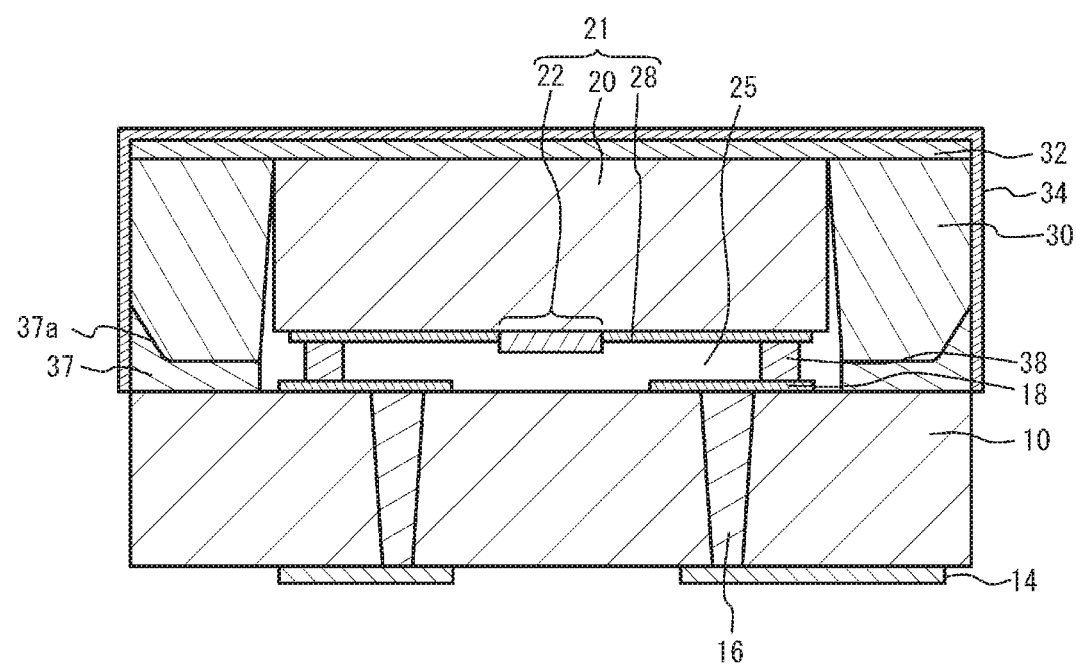
FIG. 10 is a cross-sectional view of an electronic component according to a second variation of the first embodiment.

FIG. 10 is a cross-sectional view of an electronic component according to a second variation of the first embodiment. As illustrated in FIG. 10, the substrate 10 is an insulating substrate, and the functional element 12 may not be located on the substrate 10. The insulating substrate includes, for example, a ceramic multilayered substrate such as High Temperature Co-fired Ceramic (HTCC) or Low Temperature Co-fired Ceramic (LTCC), a sapphire substrate, a glass substrate, a HICERAM substrate, or a resin substrate. Other structures are the same as those of the first embodiment, and the description thereof is thus omitted.

Figure 11:
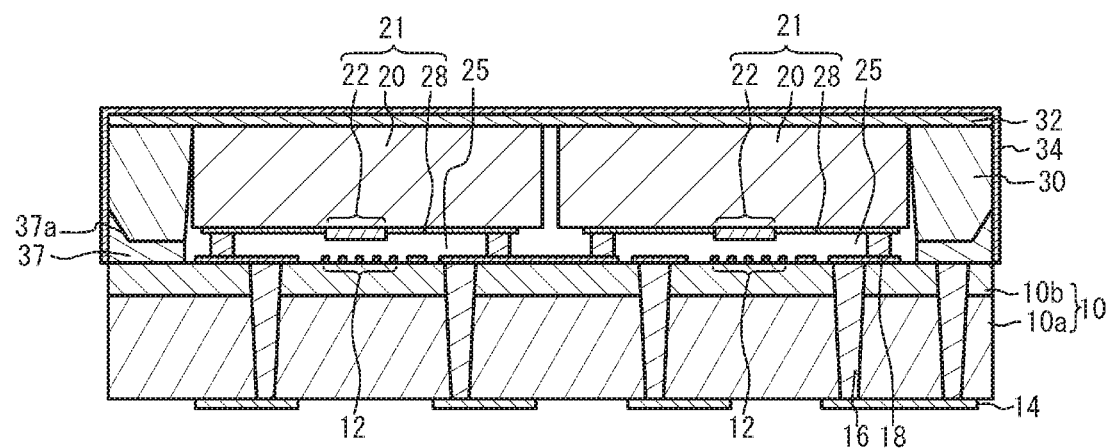
FIG. 11 is a cross-sectional view of an electronic component according to a third variation of the first embodiment.

FIG. 11 is a cross-sectional view of an electronic component according to a third variation of the first embodiment. As illustrated in FIG. 11, a plurality of functional elements 12 are formed on the substrate 10. A plurality of substrate 20 are mounted on the substrate 10. Other structures are the same as those of the first embodiment, and the description thereof is thus omitted.

Second Embodiment

Figure 12:
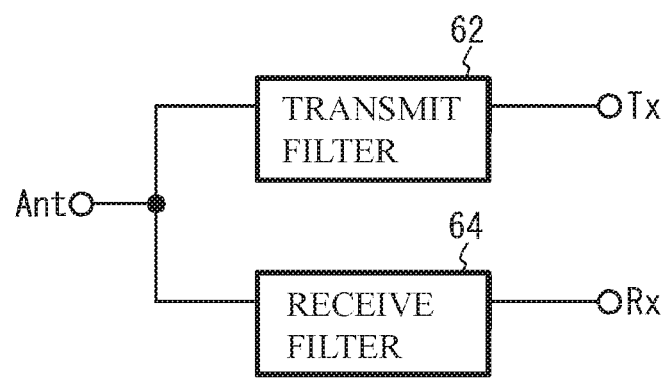
FIG. 12 is a circuit diagram of a duplexer according to a second embodiment.

A second embodiment illustrates an example of a multiplexer such as a duplexer. FIG. 12 is a circuit diagram of the duplexer according to the second embodiment. As illustrated in FIG. 12, a transmit filter 62 is connected between a common terminal Ant and a transmit terminal Tx. A receive filter 64 is connected between the common terminal Ant and a receive terminal Rx. The transmit filter 62 transmits signals in the transmit band to the common terminal Ant among high-frequency signals input from the transmit terminal Tx, and suppresses other signals. The receive filter 64 transmits signals in the receive band to the receive terminal Rx among high-frequency signals input from the common terminal Ant, and suppresses other signals.

The transmit filter 62 is formed with the functional element 22 of the first embodiment, and the receive filter 64 is formed with the functional element 12 of the first embodiment. Thereby, the electronic component of the first embodiment serves as the duplexer. Although an example of the duplexer is explained as the multiplexer, a triplexer or quadplexer may be used as the multiplexer. For example, in the third variation of the first embodiment, a plurality of filters can be formed on the substrate 10, and a filter can be formed on each of the device chips 21.

In the first embodiment and the variations thereof, both of the functional elements 12 and 22 may be surface acoustic wave elements or piezoelectric thin film resonators. Alternatively, the functional element 12 may be a piezoelectric thin film resonator, and the functional element 22 may be a surface acoustic wave element. The functional elements 12 and 22 may be other than acoustic wave elements. For example, the functional element may be an active element such as an amplifier and/or a switch. Alternatively, the functional element may be a passive element such as an inductor and/or a capacitor.

Although the embodiments of the present invention have been described in detail, it is to be understood that the various change, substitutions, and alterations could be made hereto without departing from the spirit and scope of the invention.

What is claimed is:

1. An electronic component comprising:
   a substrate;
   a device chip, in which a functional element is located on a lower surface thereof, that is mounted on an upper surface of the substrate so that the functional element and the upper surface of the substrate are opposite to each other via an air gap;
   a ring-shaped metal layer that is located on the upper surface of the substrate, surrounds the device chip in a plan view, and has a protruding part located along an outer periphery thereof, an outer side surface of the ring-shaped metal layer being higher than an inner side surface thereof;
   a metal sealer that surrounds the device chip in the plan view, and is bonded on an upper surface of the ring-shaped metal layer; and
   a metal film that is located on side surfaces of the metal sealer and the ring-shaped metal layer,
   wherein the metal sealer does not bond to an upper surface of the substrate inside the ring-shaped metal layer, an inside of the metal sealer includes the air gap, and the metal film, the protruding part and the metal sealer and the air gap overlap in a perpendicular direction to a side surface of the device chip.

2. The electronic component according to claim 1, wherein an apex of the protruding part of the ring-shaped metal layer is located above a middle position between the upper surface of the substrate and the lower surface of the device chip.

3. The electronic component according to claim 1, wherein the ring-shaped metal layer is made of at least one of copper, nickel, gold, aluminium and silver.

4. The electronic component according to claim 1, further comprising:

a lid located on the upper surfaces of the device chip and the metal sealer.

5. The electronic component according to claim 1, wherein the substrate includes a support substrate and a piezoelectric substrate bonded on an upper surface of the support substrate, and the ring-shaped metal layer is embedded in the piezoelectric substrate.

6. The electronic component according to claim 1, wherein the ring-shaped metal layer is a copper layer, the metal layer is a nickel layer, and the metal sealer is a solder layer.

7. The electronic component according to claim 1, wherein the functional element is an acoustic wave element.

8. The electronic component according to claim 1, wherein an inner surface of the metal sealer is in contact with the air gap in a region where the protruding part and the metal sealer and the air gap overlap in the perpendicular direction.

* * * * *